US009921497B2

(12) United States Patent
Janssen et al.

(10) Patent No.: US 9,921,497 B2
(45) Date of Patent: Mar. 20, 2018

(54) LITHOGRAPHIC APPARATUS AND DEVICE MANUFACTURING METHOD

(71) Applicant: ASML NETHERLANDS B.V., Veldhoven (NL)

(72) Inventors: Gerardus Arnoldus Hendricus Franciscus Janssen, Eindhoven (NL); Martijn Van Baren, Veghel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/306,982

(22) PCT Filed: Mar. 17, 2015

(86) PCT No.: PCT/EP2015/055549
§ 371 (c)(1),
(2) Date: Oct. 26, 2016

(87) PCT Pub. No.: WO2015/165639
PCT Pub. Date: Nov. 5, 2015

(65) Prior Publication Data
US 2017/0052463 A1    Feb. 23, 2017

(30) Foreign Application Priority Data
Apr. 30, 2014  (EP) .................................. 14166492

(51) Int. Cl.
*G03F 7/20* (2006.01)
*H01L 21/67* (2006.01)
*H01L 21/677* (2006.01)

(52) U.S. Cl.
CPC .......... *G03F 7/70875* (2013.01); *G03F 7/708* (2013.01); *G03F 7/7075* (2013.01);
(Continued)

(58) Field of Classification Search
CPC .. G03F 7/70691; G03F 7/70733; G03F 7/708; G03F 7/70841; G03F 7/70858;
(Continued)

(56) References Cited

U.S. PATENT DOCUMENTS
4,989,031 A    1/1991  Kamiya
2004/0179178 A1  9/2004  Emoto
(Continued)

FOREIGN PATENT DOCUMENTS
EP    0 844 532      5/1998
JP    2-199814 A     8/1990
(Continued)

OTHER PUBLICATIONS
Singapore Written Opinion dated Mar. 20, 2017 in corresponding Singapore Patent Application No. 11201608032Y.
International Search Report and Written Opinion dated Jul. 2, 2015 in corresponding International Patent Application No. PCT/EP2015/055549.
Taiwan Office Action dated Aug. 24, 2016 in corresponding Taiwan Patent Application No. 104110542.
(Continued)

*Primary Examiner* — Michelle M Iacoletti
(74) *Attorney, Agent, or Firm* — Pillsbury Winthrop Shaw Pittman, LLP

(57) ABSTRACT

A substrate handling system includes: a thermal shield for thermally insulating a space through which a substrate passes, from a thermal load originating outside the space, the thermal shield including: a first wall and a second wall with a gap therebetween, the first wall positioned between the space and the second wall; an inlet opening configured to allow a flow of gas from a gas source to enter the gap from outside the space; and an outlet opening configured to allow the flow of gas to exit the gap to outside of the space, wherein the system is configured to direct the flow of gas to enter the gap through the inlet opening, to flow through the gap and out of the gap to outside the space through the outlet opening thereby to reduce thermal fluctuations in the space due to the thermal load originating outside the space.

23 Claims, 3 Drawing Sheets

(52) U.S. Cl.
CPC ...... *G03F 7/70808* (2013.01); *G03F 7/70841* (2013.01); *G03F 7/70858* (2013.01); *G03F 7/70866* (2013.01); *H01L 21/67* (2013.01); *H01L 21/6719* (2013.01); *H01L 21/67196* (2013.01); *H01L 21/67265* (2013.01); *H01L 21/67742* (2013.01)

(58) Field of Classification Search
CPC ............... G03F 7/70866; G03F 7/7075; G03F 7/70808; G03F 7/70875; H01L 21/67; H01L 21/67265; H01L 21/67248; H01L 21/67184; H01L 21/6719; H01L 21/67196; H01L 21/67742
See application file for complete search history.

(56) References Cited

U.S. PATENT DOCUMENTS

| | | |
|---|---|---|
| 2008/0247845 A1 | 10/2008 | Mochizuki et al. |
| 2009/0197362 A1 | 8/2009 | Ueno et al. |
| 2012/0026479 A1 | 2/2012 | Hembacher et al. |
| 2013/0171831 A1 | 7/2013 | Namba et al. |

FOREIGN PATENT DOCUMENTS

| | | |
|---|---|---|
| JP | 1990-199814 A | 8/1990 |
| JP | 10-209040 A | 8/1998 |
| JP | 2000-005589 A | 1/2000 |
| JP | 2001-023690 A | 1/2001 |
| JP | 2004-273864 A | 9/2004 |
| JP | 2006/261273 | 9/2006 |
| JP | 2006-330165 A | 12/2006 |
| JP | 2007-013172 A | 1/2007 |
| TW | M324231 | 12/2007 |

OTHER PUBLICATIONS

Office Action issued in corresponding Chinese Patent Application No. 201580023034.5 dated Aug. 18, 2017.

Notification of Reasons for Refusal issued in corresponding Japanese Patent Application No. 2016-559420 dated Nov. 9, 2017 with English translation.

Written Opinion issued in corresponding Singapore Application No. 11201608032Y dated Dec. 4, 2017.

Office Action issued in corresponding Korean Patent Application No. 10-2016-7029798 dated Dec. 5, 2017 with English translation.

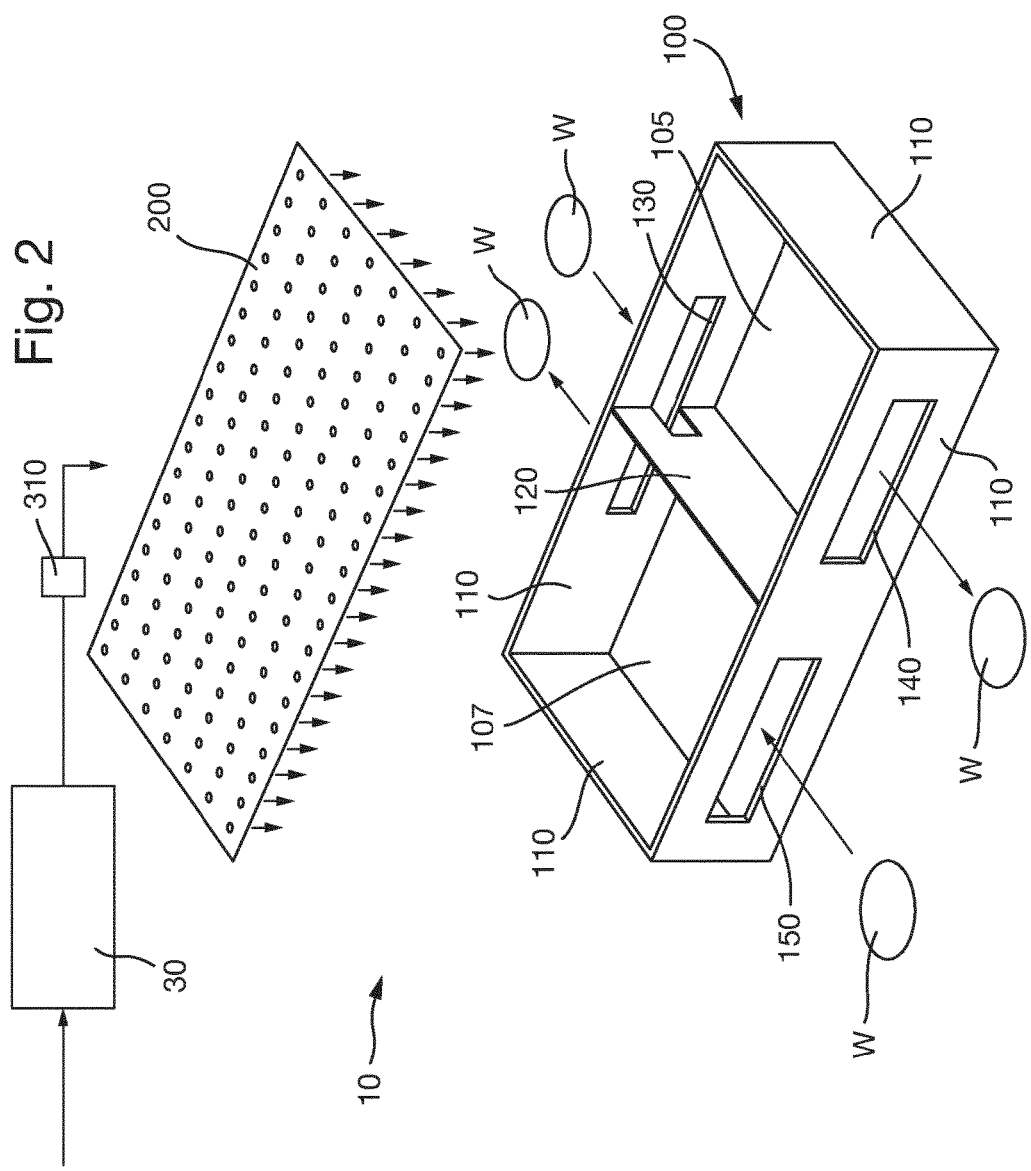

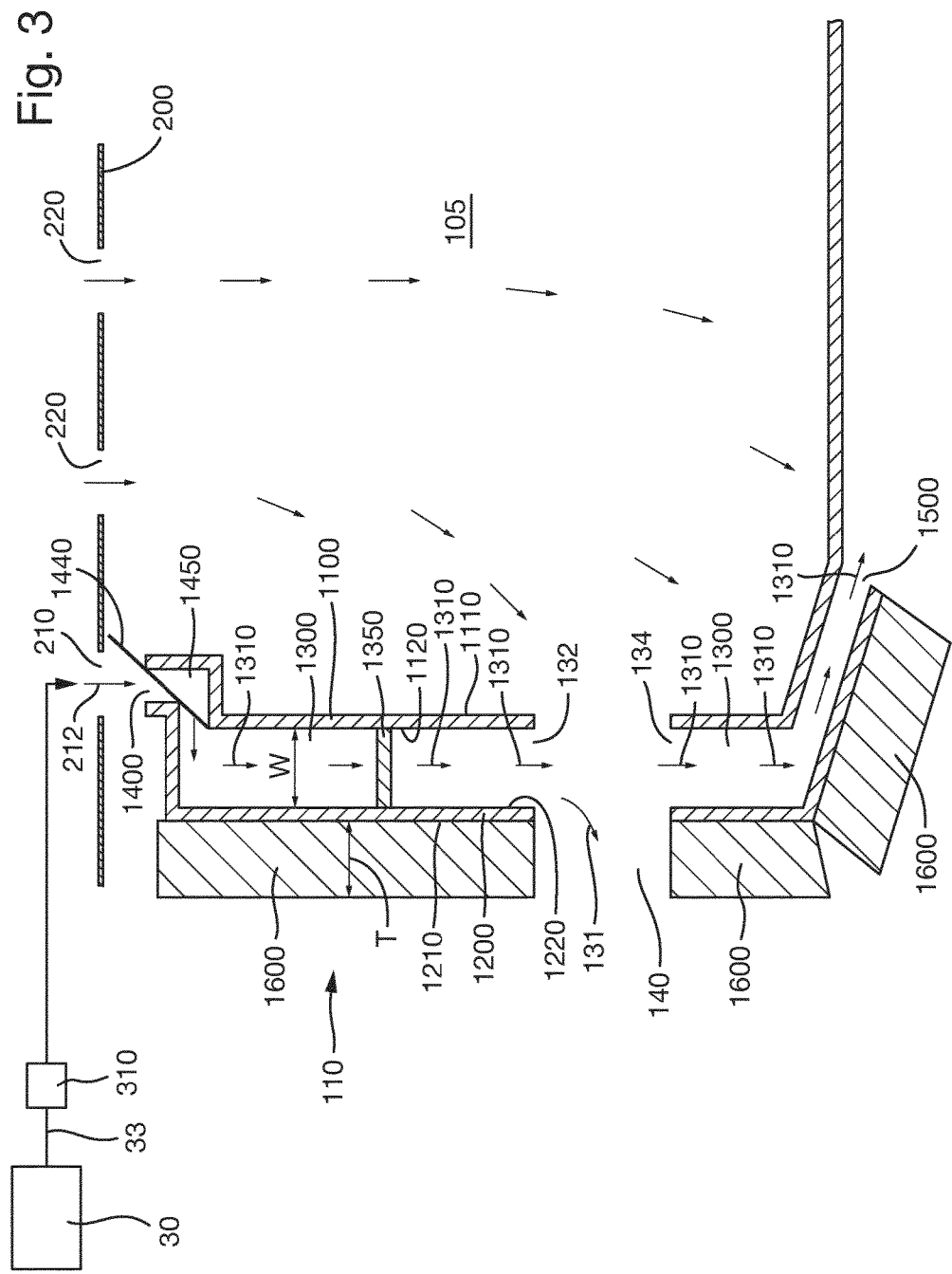

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2015/055549, which was filed on Mar. 17, 2015, which claims the benefit of priority of EP application no. 14166492.0, which was filed on Apr. 30, 2014, and which is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The temperature stability of some components in a lithographic apparatus and components associated with a lithographic apparatus, as well as some objects which enter a lithographic apparatus, is important. Typically such components are maintained at a target set-point temperature. There are many different thermal loads originating in and around a lithographic apparatus which can cause the temperature of components to rise above or fall below their target set-point temperature. Therefore thermal shields are used in a lithographic apparatus for thermally insulating components from a thermal load.

One use of a thermal shield is in a system which is configured to handle a substrate. For example a thermal shield can be used in a system which receives a substrate, ensures the temperature stability of the substrate, and provides the substrate to a lithographic apparatus. Additionally, after imaging of the substrate in the lithographic apparatus, the system can receive the substrate from the lithographic apparatus and pass it on for further processing. The temperature stability of a substrate is important because temperature instabilities in the substrate can lead to imaging errors, such as overlay errors. Therefore, a space in the system through which the substrate passes is thermally shielded with the thermal shield for thermally insulating the space from a thermal load originating outside the space.

A thermal shield comprising an insulating material is known. However, the effectiveness of such a thermal shield is dependent on the low thermal conductivity and thickness of the insulating material. In a lithographic apparatus space is at a premium and a thermal shield with good enough thermal insulating performance made only of an insulating material is undesirably bulky.

A thermal shield comprising a wall thermally conditioned with a flowing liquid (e.g. a water jacket) has good thermal shielding properties and takes up less volume than a thermal shield made only of insulating material. However, a wall thermally conditioned with liquid has the disadvantages of increased complexity due to the necessity to make liquid tight seals and the risk of damage to the apparatus due to liquid leaks.

It is an aim of the present invention to provide a system for use with a lithographic apparatus, wherein the system is configured to handle a substrate and thermally insulate a space through which the substrate passes from at thermal load originating outside the space.

SUMMARY OF THE INVENTION

According to an aspect of the invention, there is provided a system for use with a lithographic apparatus, the system configured to handle a substrate, wherein the system is adapted to be coupled to a gas source, the system comprising: a space through which the substrate passes; and a thermal shield for thermally insulating the space from a thermal load originating outside the space, the thermal shield comprising: a first wall and a second wall with a gap therebetween, the first wall being positioned between the space and the second wall; at least one inlet opening configured to allow a flow of gas from the gas source to enter the gap from outside the space; and at least one outlet opening configured to allow the flow of gas to exit the gap to outside of the space, wherein the system is adapted to direct the flow of gas from the gas source to enter the gap through the at least one inlet opening, to flow through the gap and out of the gap to outside the space through the at least one outlet opening thereby to reduce thermal fluctuations in the space due to the thermal load originating outside the space.

According to an aspect of the invention, there is provided a method of thermally insulating a space through which a substrate passes, the method comprising: providing a thermal shield between a thermal load originating outside the space and the space and directing a gas into a gap in the thermal shield from outside the space, through the gap, and out of the gap to outside the space thereby to reduce thermal fluctuations in the space due to the thermal load originating outside the space.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 is a perspective view of a system according to the present invention; and FIG. 3 is a cross sectional view of a thermal shield according to the present invention.

DETAILED DESCRIPTION

Figure 1:
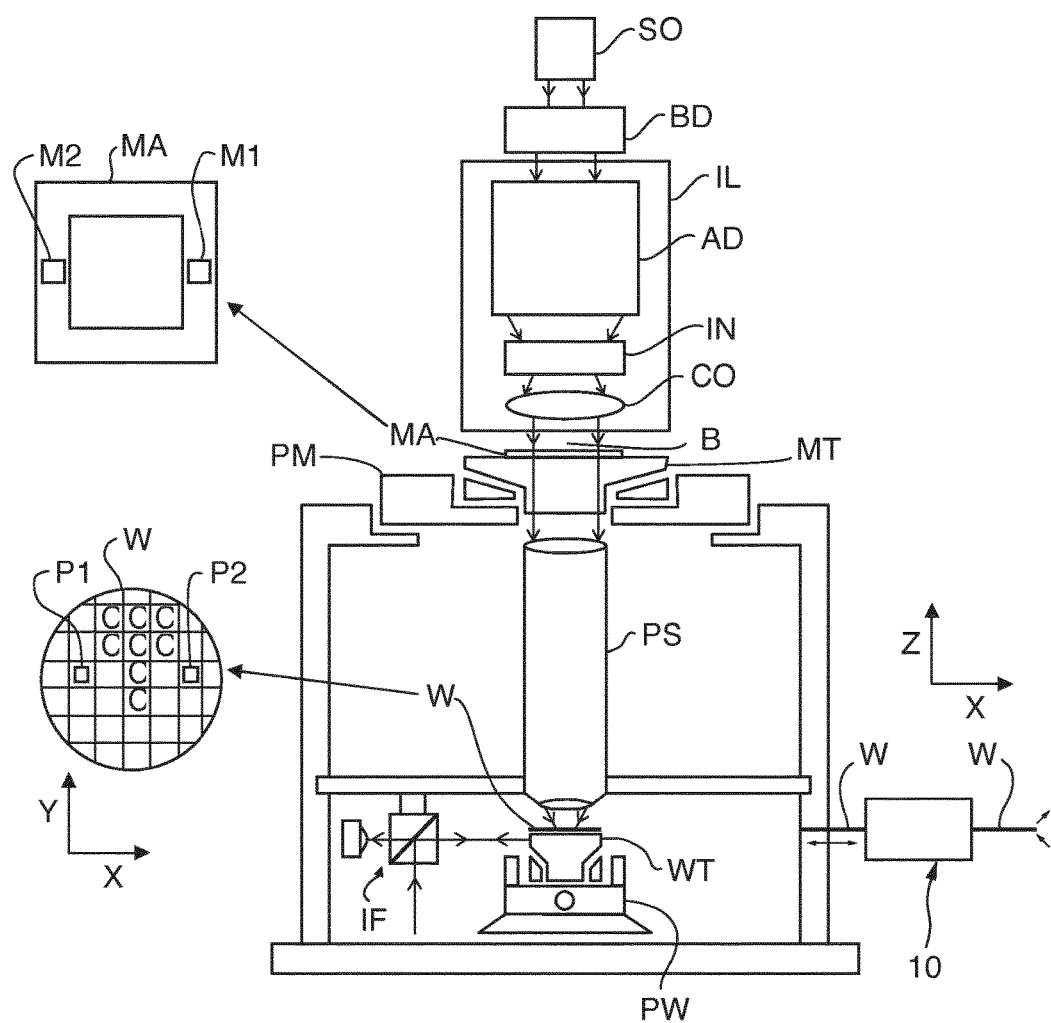
FIG. 1 depicts a lithographic apparatus according to an embodiment of the present invention.

FIG. 1 schematically depicts a lithographic apparatus according to one embodiment of the invention. The apparatus comprises:
- an illumination system (illuminator) IL configured to condition a radiation beam B (e.g. UV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:
1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2 illustrates schematically and in perspective view a system 10 according to an embodiment. The system 10 is for use with a lithographic apparatus, in particular a lithographic projection apparatus, for example a lithographic projection apparatus such as described above with reference to FIG. 1. As illustrated in FIG. 1, the system 10 is for providing a substrate W to the lithographic projection apparatus and taking a substrate W from the lithographic projection apparatus.

The system 10 is configured to handle a substrate W. In an embodiment the system 10 is configured to receive a substrate W from a pre-processing unit. In an embodiment the pre-processing unit cleans and/or applies a photoresist coating to the substrate W or otherwise prepares the substrate W for exposure. The substrate W is passed through a first space 105 of the system 10. In an embodiment, whilst the substrate W is in the first space 105, it may be temperature conditioned. That is, the substrate W may have its temperature homogenized and adjusted to within a predetermined range of a target set-point temperature. Once the substrate W in the first space 105 has been temperature conditioned, and once the lithographic projection apparatus to which the system 10 is connected is ready, the substrate W is moved out of the first space 105 to the lithographic projection apparatus.

In an embodiment, after the substrate W has been imaged in the lithographic projection apparatus, it is passed back to the system 10 and passes through a second space 107 and out of the system 10 to a post-processing unit. In an embodiment the post-processing unit may apply a post-exposure bake and/or develop exposed photoresist and/or etch the substrate or layers on the substrate not protected by photoresist.

In an embodiment, the system 10 only has a single space and is not split into a first space 105 and second space 107. Such a system 10 is otherwise the same as described herein.

In an embodiment actuators which are part of the system 10 and at least partly housed within the first and second spaces 105, 107 are used for moving the substrates W in and out of the first space 105 and second space 107. In an embodiment actuators for moving the substrates W are part of the lithographic projection apparatus and/or part of a pre-processing unit and/or the post-processing unit rather than the system 10.

A thermal load may originate outside the first space 105 and/or second space 107. For example a thermal load may originate from an electrical component such as a motor (a heating thermal load) or a conduit carrying cooling liquid (a cooling thermal load). Such a thermal load can deleteriously affect the temperature or temperature homogeneity of a substrate W in the first space 105 and/or second space 107. This may be via a conduction, convection and/or radiation mechanism in which energy is transferred between the thermal load and the substrate W. To thermally insulate the first space 105 and/or second space 107 from such a thermal load, the system 10 comprises a thermal shield 110.

The thermal shield 110 is positioned between the first space 105 and/or second space 107 and the thermal load originating outside the space 105/107. The thermal shield 110 may form at least part of a housing defined by at least one housing wall. The at least one housing wall at least partly surrounds the first space 105 and/or second space 107. In an embodiment the thermal shield 110 forms one of the at least one housing walls.

In the embodiment of FIG. 2 the thermal shield 110 comprises at least one substrate opening 130, 140, 150 for the passage therethrough of a substrate W. In the embodiment of FIG. 2 the system 10 comprises three substrate openings 130, 140, 150 defined in the thermal shield 110. The first substrate opening 130 is an opening for passing a substrate W from outside of the system 10 into the first space 105. A substrate W can move from outside of the system 10 (for example from the substrate pre-processing unit) through the thermal shield 110 into the first space 105.

The substrate W can move from the first space 105 into the lithographic projection apparatus through the second substrate opening 140.

In an embodiment, after the substrate W has been imaged in the lithographic projection apparatus, it is returned to the system 10. The substrate W passes through a third opening 150 into the second space 107. The substrate W is moved from the second space 107 to outside of the system 10 through the first substrate opening 130 in the thermal shield 110. After the substrate W has passed out of the system 10 through the first opening 130, it is provided to the substrate post-processing unit.

The principle of the thermal shield 110 will now be explained with reference to FIG. 3 which is a cross-sectional view of the thermal shield 110 at the position of the second substrate opening 140. The principles are described in relation to thermally shielding the first space 105, but the principles apply equally to how the second space 107 is thermally shielded.

The thermal shield 110 comprises a first wall 1100 and a second wall 1200. A gap 1300 is between the first wall 1100 and the second wall 1200. That is, the first wall 1100 and second wall 1200 are spaced apart. The first wall 1100 is positioned between the first space 105 and the second wall 1200. That is, the second wall 1200 is the outer of the first wall 1100 and second wall 1200 with respect to the first space 105.

An inlet opening 1400 is provided which is in fluid communication with the gap 1300. The inlet opening 1400 allows a flow of gas 212 from a gas source 30 to enter the gap 1300. Arrows 1310 illustrate a flow of gas through the gap 1300. As the gas flows through the gap 1300, it absorbs or emits energy from/into the first space 105 and/or from/into the atmosphere outside of the system 10, thereby to compensate for the thermal load.

In an embodiment one or more spacers 1350 may be present in the gap 1300 to connect together and/or hold apart the first wall 1100 and second wall 1200. The spacer 1350 may be made of a material with a low coefficient of thermal conductivity (compared to the coefficient of thermal conductivity of the material of the first wall 1100 and second wall 1200). An example material of the spacers 1350 is a thermoplastic elastomeric foam (TPE).

In an embodiment gas from the gas source 30 may be thermally conditioned (have its temperature adjusted to be within a predetermined range of a set-point temperature). In an embodiment, the set-point temperature is the same as the set-point temperature for the substrate W passing through the first space 105. Therefore, any variation in the temperature of the substrate W from the set-point temperature will be compensated for by the gas taking energy from or passing energy to the substrate W.

The gas from the gas source 30 may be provided in any way to the inlet opening 1400. This may be by way of a direct connection of one or more conduits between the gas source 30 and the inlet opening 1400 or may be, as illustrated, by way of passing gas from the gas source 30 through an opening 210 of an array of openings 210, 220 to provide a flow of gas 212 into the inlet opening 1400. In an embodiment the system 10 may comprise a connector 310 for the connection one or more conduits extending from the gas source 30, which is not part of the system 10, to the system 10. The gas from the gas source 30 may have its temperature adjusted and/or homogenized upstream or downstream of the gas source 30. The temperature of the gas may be adjusted and/or homogenized by a component of the system 10.

In the embodiment of FIGS. 2 and 3 only one inlet opening 1400 is shown. The inlet opening 1400 extends all the way around the outside, in plan, of the first space 105 and second space 107. In an embodiment more than one inlet opening 1400 may be provided. A plurality of inlet openings 1400 may be provided at spaced apart intervals along the thermal shield 110. In an embodiment each opening 210 may be aligned with an inlet opening 1400.

In an embodiment the system 10 is adapted to direct the flow of gas 212 from the gas source 30 to enter the gap 1300 through the at least one inlet opening 1400. The gas is then directed to flow through the gap 1300 and out of the gap 1300 to outside the first and second space 105, 107 through at least one outlet opening 1500. As gas flows 1310 through the gap 1300, it thermally conditions the first and second walls 1100, 1200 of the thermal shield 110. The gas exiting the gap 1300 through the at least one outlet opening 1500 exits to a position outside of the first space 105 (e.g. to a position outside of the system 10). In this way thermal fluctuations in the first space 105 due to the thermal load originating outside the first space 105 are reduced.

In an embodiment, the gap 1300 has a width W (a distance between outer surface 1120 of the first wall 1100 and inner surface 1220 of the second wall 1200 defining the gap 1300) of between 10 and 20 mm. If the width W is less than 10 mm, the resistance to the flow 1310 of gas through the gap 1300 becomes too great. If the width W is greater than 20 mm, uniformity of the flow 1310 of gas in the gap 1300 can be adversely affected. Additionally, space is at a premium in lithographic apparatus and increasing the width of the gap W deleteriously increases the volume of the system 10. A typical velocity of gas through the gap 1300 is between 0.1 and 0.5 m/s.

The position of the at least one inlet opening 1400 and at least one outlet opening 1500 may be chosen to maximize the rate at which gas is replaced by new gas on the outer surface 1120 of the first wall 1100 and the inner surface 1220 of the second wall 1200. This flow of gas in the gap 1300 can be simulated, for example using finite element analysis using known techniques, and this can be used to adjust the position of the at least one inlet opening 1400 and at least one outlet opening 1500 to achieve a good compromise between system complexity, location of inlet openings 1400 and outlet openings 1500 and gas refresh rate at all parts of the outer surface 1120 of the first wall 1100 and the inner surface 1220 of the second wall 1200.

In order to optimize flow 1310 of gas through the gap 1300, an under pressure source (not depicted in FIG. 3) may be connected to the at least one outlet opening 1500. That is, the under pressure source may be a vacuum source with a pressure lower than the pressure of gas in the gap 1300 and/or in gas outside and in contact with and surrounding the system 10. This draws the flow 1310 of gas towards the outlet opening 1500. This can be used to optimize the flow rate and/or flow direction of gas and/or refresh rate of gas in the gap 1300. The magnitude of under pressure applied to an outlet opening 1500 may be different to that applied to other outlet openings 1500, thereby influencing the pattern of flow 1310 of gas in the gap 1300.

In an embodiment, as illustrated in FIG. 3, a tortuous path 1450, in cross-section, leads from the inlet opening 1400 to the gap 1300. The tortuous path 1450 is provided to prevent light from entering the gap 1300 between the first wall 1100 and the second wall 1200. This is achieved by ensuring that there is no imaginary straight line 1440 which can extend through the inlet opening 1400 and into the gap 1300 without impinging on the first wall 1100 or second wall 1200. This is advantageous as it prevents light from entering the gap 1300 and applying a heat load to the outer surface 1120 of the first wall 1100 and the inner surface 1220 of the second wall 1200.

In the embodiment of FIG. 3, the second substrate opening 140 is illustrated. The second substrate opening 140 is configured for the passage therethrough of a substrate W out of the first space 105. The first substrate opening 130 and third substrate opening 150 can be arranged in the same way.

In an embodiment, the second substrate opening 140 is open to the gap 1300 such that at least one outlet opening and/or inlet opening can be seen as being defined around the edge of the second substrate opening 140. That is, some of the gas flow 1310 in the gap 1300 exits the gap 1300 (as illustrated by arrow 131) at the second substrate opening 140 and some of the gas flow 1310 passes across the second substrate opening 140 and down on into the remainder of the gap 1300 and then out through the outlet opening 1500. In an embodiment, the second substrate opening 140 is closed to the gap 1300.

In an embodiment the first space 105 is held at an over pressure compared to atmosphere immediately outside the system 10 (for example at a pressure greater than gas outside and in contact with the system 10). This ensures a flow of gas from inside the first space 105 through the second substrate opening 140 to outside of the system 10. This reduces the chance of contaminants carried in a gas flow passing through the first substrate opening 130 into the first space 105.

Other openings 220 are provided for the passage there through of gas from the gas source 30. The flow of gas from the other openings 220 is directed to provide a flow of gas into the first space 105 (and the second space 107). This has the advantage that the gas provided to the gap 1300 and the gas provided to the first space 105 has substantially the same temperature and helps in improving the thermal stability of the first space 105. As described elsewhere, the gas provided to the first space 105 may result in a pressure of gas in the first space 105 which is greater than a pressure of gas in contact with an atmosphere immediately surrounding the system 10. The magnitude of the over pressure may be of the order of 0.3 to 5 Pa. As a result, a net outflow of gas, for example through the substrate openings 130, 140, 150 is provided. However, this need not be the case, and for example gas may flow from the lithographic projection apparatus into the second space 107 through the third substrate opening 150.

In an embodiment the openings 210, 220 may be in the form of a two dimensional array of openings. The extent of the openings 210, 220 may be equal to or greater than that of the system 10, in plan. The openings 210, 220 may be defined in a plate 200. The openings 210, 220 may be fluidly connected to a single chamber upstream of the openings 210, 220 thereby substantially to homogenize the flow of gas through each of the openings 210, 220. In an embodiment about 5-20% of gas exiting the openings 210, 220 enters the gap 1300.

It may not be possible to meet the thermal specification for the thermal shield 110 by only providing a first wall 1100 and second wall 1200 with a gap 1300 there between. Therefore, in an embodiment an additional layer of insulating material (a material with a thermal conductivity less than that of the material of the first wall 1100 and second wall 1200) may be provided. The first wall 1100 and second wall 1200 may be provided between the first space 105 and the layer of thermal insulation material 1600. The layer of thermal insulation material 1600 may be adhered to an outer surface 1210 of the second wall 1200. In an embodiment, the thermal insulation material 1600 is additionally or alternatively adhered to an inner surface 1110 of the first wall 1100 which faces the first space 105. In an embodiment the layer of thermal insulation material 1600 may be a thermoplastic elastomeric foam (TPE) such as ThermoSmart™ available from Thermaflex or other extruded cross-linked polyethylene. In an embodiment the layer of thermal insulation material 1600 may have a thickness T of between 10 and 30 mm, desirably between 15 and 25 mm.

The embodiment of FIGS. 2 and 3 shows a downward flow of gas in the gap 1300. This need not necessarily be the case and an upwards flow of gas, in the direction of convection currents may be more preferable.

In an embodiment, such as illustrated, the space through which the substrate W passes is divided into a first space 105 and a second space 107. A separating wall 120 may be provided to separate the first space 105 from the second space 107. Therefore, the system 10 is divided into a first compartment at least partly surrounding the first space 105 and through which, in use, the substrate W being loaded passes. A second compartment at least partly surrounds the second space 107 through which, in use, the substrate W being unloaded passes. The separating wall 120 may or may not be a thermal shield such as illustrated in FIG. 3 with or without a layer of insulation material.

In an embodiment the inner surface 1110 of the first wall 1100 which faces the first space 105 and/or the outer surface 1120 of the first wall 1100 may have an emissivity coefficient (the ratio of energy radiated by the surface to the energy radiated by a perfect black body at the same temperature) is less than 0.5, desirably less than 0.3 and more desirably less than 0.15 in a wavelength range of between 0.7-10 µm. In this way, if the thermal shield 110 is at a temperature different to the temperature of the substrate W in the first space 105, little energy will be transferred by way of radiation from the inner surface 1110 of the first wall 1100 to/from the first space 105. The emissivity of the inner surface 1110 of the first wall may be adjusted by surface treatment (e.g. polishing) or by applying a coating. In order to avoid transfer of energy between the first wall 1100 and second wall 1200, the outer surface 1120 of the first wall 1100 and/or the inner surface 1220 of the second wall 1200 are made to have an emissivity coefficient of less than 0.5, desirably less than 0.3 and most desirably less than 0.15.

A system in accordance with at least one of the above embodiments can be used in a device manufacturing method in which a substrate is irradiated using a projection beam.

In an embodiment, there is provided a system for use with a lithographic apparatus, the system configured to handle a substrate, wherein the system is adapted to be coupled to a gas source, the system comprising: a space through which the substrate passes; and a thermal shield for thermally insulating the space from a thermal load originating outside the space, the thermal shield comprising: a first wall and a second wall with a gap therebetween, the first wall being positioned between the space and the second wall; at least one inlet opening defined by the first wall and the second wall and configured to allow a flow of gas from the gas source to enter the gap from outside the space; and at least one outlet opening defined by the first wall and the second wall and configured to allow the flow of gas to exit the gap to outside of the space, wherein the system is adapted to direct the flow of gas from the gas source to enter the gap through the at least one inlet opening, to flow through the gap and out of the gap to outside the space through the at least one outlet opening thereby to reduce thermal fluctuations in the space due to the thermal load originating outside the space.

In an embodiment, the system is configured to pass the flow of gas from the gas source through an array of openings, at least one opening of the array of openings being positioned to provide a flow of gas into the at least one inlet opening and at least one opening of the array of openings being positioned to provide a flow of gas into at least a part of the space, such that gas flowing into the gap and into the space has substantially the same temperature. In an embodiment, the first wall has a first surface which faces said gap and the first wall has a second surface which faces said space, at least one of the first surface and/or the second surface having an emissivity coefficient of less than or equal to 0.5 in a wavelength range of between 0.7 and 10 µm. In an embodiment, the system further comprises a layer of thermal insulation material with a thermal conductivity less than that of the material of the first and/or second wall, wherein the thermal shield is positioned between the layer of thermal insulation material and the space, and/or further comprising an underpressure source attached to said at least one outlet opening for applying to the gap an underpressure compared to an ambient pressure of a gas in contact with and surrounding the system. In an embodiment, the system further comprises a housing defined by at least one housing wall for at least partly surrounding the space and wherein the thermal shield forms one of the at least one housing wall. In an embodiment, the thermal shield further comprises a substrate opening through the first wall and second wall, the substrate opening being configured for the passage therethrough of a substrate into or out of said space, the substrate opening being open to said gap such that one of said at least one outlet openings is defined around the edge of the substrate opening.

In an embodiment, there is provided a substrate loader configured for processing a substrate, the processing comprising at least one of loading the substrate into and/or unloading the substrate from a lithographic projection apparatus, the substrate loader comprising a system described herein. In an embodiment, the system comprises a first compartment and a second compartment, the first compartment at least partly surrounding a part of the space, through which, in use, the substrate being loaded passes and the second compartment at least partly surrounding a part of the space, through which, in use, the substrate being unloaded passes.

In an embodiment, there is provided a method of thermally insulating a space through which a substrate passes, the method comprising: providing a thermal shield comprising a first wall and a second wall with a gap therebetween between a thermal load originating outside the space and the space and directing a gas into the gap from outside the space through at least one inlet opening defined by the first wall and the second wall, through the gap, and out of the gap to outside the space through at least one outlet opening defined by the first wall and the second wall thereby to reduce thermal fluctuations in the space due to the thermal load originating outside the space.

In an embodiment, there is provided a device manufacturing method comprising projecting a patterned beam of radiation onto the substrate using a lithographic apparatus, wherein a space through which the substrate passes is thermally insulated using a method as described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A system configured to handle a substrate, wherein the system is adapted to be coupled to a gas source, the system comprising:
    a thermal shield configured to thermally insulate a space through which the substrate passes, from a thermal load originating outside the space, the thermal shield comprising:
        a first wall and a second wall with a gap therebetween, the first wall positioned between the space and the second wall;
        at least one inlet opening defined by the first wall and the second wall and configured to allow a flow of gas from the gas source to enter the gap from outside the space; and
        at least one outlet opening defined by the first wall and the second wall and configured to allow the flow of gas to exit the gap to outside of the space,
    wherein the system is configured to direct the flow of gas from the gas source to enter the gap through the at least one inlet opening, to flow through the gap and out of the gap to outside the space through the at least one outlet opening, to reduce thermal fluctuations in the space due to the thermal load originating outside the space, and
    wherein the system is configured to pass the flow of gas from the gas source through an array of openings, at least one opening of the array of openings being positioned to provide a flow of gas into the at least one inlet opening and at least one opening of the array of openings being positioned to provide a flow of gas into at least a part of the space, such that gas flowing into the gap and into the space has substantially the same temperature.

2. The system of claim 1, wherein the first wall has a first surface which faces the gap and the first wall has a second surface which faces the space, the first surface and/or the second surface having an emissivity coefficient of less than or equal to 0.5 in a wavelength range of between 0.7 and 10 µm.

3. The system of claim 1, further comprising a layer of thermal insulation material with a thermal conductivity less than that of the material of the first and/or second wall, wherein the thermal shield is positioned between the layer of thermal insulation material and the space.

4. The system of claim 1, further comprising a housing defined by at least one housing wall to at least partly surround the space and wherein the thermal shield forms at least one housing wall of the at least one housing wall.

5. The system of claim 1, wherein the thermal shield further comprises a substrate opening through the first wall and second wall, the substrate opening configured for the passage therethrough of a substrate into or out of the space, the substrate opening being open to the gap such that at least one outlet opening of the at least one outlet opening is defined around the edge of the substrate opening.

6. A substrate loader configured for processing a substrate, the processing comprising loading the substrate into and/or unloading the substrate from, a lithographic projection apparatus, the substrate loader comprising the system of claim 1.

7. The substrate loader of claim 6, wherein the system comprises a first compartment and a second compartment, the first compartment at least partly surrounding a part of the space, through which, in use, the substrate being loaded passes and the second compartment at least partly surrounding a part of the space, through which, in use, the substrate being unloaded passes.

8. A method of thermally insulating a space through which a substrate passes, the method comprising:
providing a thermal shield comprising a first wall and a second wall with a gap therebetween between a thermal load originating outside the space and the space and directing a gas into the gap from outside the space through at least one inlet opening defined by the first wall and the second wall, through the gap, and out of the gap to outside the space through at least one outlet opening defined by the first wall and the second wall, to reduce thermal fluctuations in the space due to the thermal load originating outside the space.

9. A device manufacturing method comprising projecting a patterned beam of radiation onto the substrate using a lithographic apparatus, wherein a space through which the substrate passes is thermally insulated using the method of claim 8.

10. The method of claim 8, comprising passing a flow of gas through an array of openings, at least one opening of the array of openings being positioned to provide a flow of gas into the at least one inlet opening and at least one opening of the array of openings being positioned to provide a flow of gas into at least a part of the space, such that gas flowing into the gap and into the space has substantially the same temperature.

11. The method of claim 8, wherein the first wall has a first surface which faces the gap and the first wall has a second surface which faces the space, the first surface and/or the second surface having an emissivity coefficient of less than or equal to 0.5 in a wavelength range of between 0.7 and 10 µm.

12. The method of claim 8, further comprising using a layer of thermal insulation material with a thermal conductivity less than that of the material of the first and/or second wall, wherein the thermal shield is positioned between the layer of thermal insulation material and the space.

13. The method of claim 8, further comprising at least partly surrounding the space with a housing defined by at least one housing wall, wherein the thermal shield forms at least one housing wall of the at least one housing wall.

14. The method of claim 8, wherein the thermal shield further comprises a substrate opening through the first wall and second wall, the substrate opening configured for the passage therethrough of a substrate into or out of the space, the substrate opening being open to the gap such that at least one outlet opening of the at least one outlet opening is defined around the edge of the substrate opening.

15. A system configured to handle a substrate, wherein the system is adapted to be coupled to a gas source, the system comprising:
a thermal shield configured to thermally insulate a space through which the substrate passes, from a thermal load originating outside the space, the thermal shield comprising:
a first wall and a second wall with a gap therebetween, the first wall positioned between the space and the second wall;
at least one inlet opening defined by the first wall and the second wall and configured to allow a flow of gas from the gas source to enter the gap from outside the space;
at least one outlet opening defined by the first wall and the second wall and configured to allow the flow of gas to exit the gap to outside of the space; and
a substrate opening through the first wall and second wall, the substrate opening configured for the passage therethrough of a substrate into or out of the space, the substrate opening being open to the gap such that at least one outlet opening of the at least one outlet opening is defined around the edge of the substrate opening,
wherein the system is configured to direct the flow of gas from the gas source to enter the gap through the at least one inlet opening, to flow through the gap and out of the gap to outside the space through the at least one outlet opening, to reduce thermal fluctuations in the space due to the thermal load originating outside the space.

16. The system of claim 15, further comprising a layer of thermal insulation material with a thermal conductivity less than that of the material of the first and/or second wall, wherein the thermal shield is positioned between the layer of thermal insulation material and the space.

17. The system of claim 15, further comprising a housing defined by at least one housing wall to at least partly surround the space and wherein the thermal shield forms at least one housing wall of the at least one housing wall.

18. A substrate loader configured for processing a substrate, the processing comprising loading the substrate into and/or unloading the substrate from, a lithographic projection apparatus, the substrate loader comprising the system of claim 15.

19. A substrate loader configured to load a substrate into and/or unload the substrate from a lithographic apparatus, the substrate loader comprising and directly connected to, a system configured to handle the substrate, wherein the system is adapted to be coupled to a gas source, the system comprising:
a thermal shield configured to thermally insulate a space through which the substrate passes, from a thermal load originating outside the space, the thermal shield comprising:

a first wall and a second wall with a gap therebetween, the first wall positioned between the space and the second wall;

at least one inlet opening defined by the first wall and the second wall and configured to allow a flow of gas from the gas source to enter the gap from outside the space; and at least one outlet opening defined by the first wall and the second wall and configured to allow the flow of gas to exit the gap to outside of the space, wherein the system is configured to direct the flow of gas from the gas source to enter the gap through the at least one inlet opening, to flow through the gap and out of the gap to outside the space through the at least one outlet opening, to reduce thermal fluctuations in the space due to the thermal load originating outside the space.

20. The substrate loader of claim 19, wherein the system is configured to pass the flow of gas from the gas source through an array of openings, at least one opening of the array of openings being positioned to provide a flow of gas into the at least one inlet opening and at least one opening of the array of openings being positioned to provide a flow of gas into at least a part of the space, such that gas flowing into the gap and into the space has substantially the same temperature.

21. The substrate loader of claim 19, further comprising a substrate opening through the first wall and second wall, the substrate opening configured for the passage therethrough of a substrate into or out of the space, the substrate opening being open to the gap such that at least one outlet opening of the at least one outlet opening is defined around the edge of the substrate opening.

22. The substrate loader of claim 19, wherein the system comprises a first compartment and a second compartment, the first compartment at least partly surrounding a part of the space, through which, in use, the substrate being loaded passes and the second compartment at least partly surrounding a part of the space, through which, in use, the substrate being unloaded passes.

23. The substrate loader of claim 19, further comprising a layer of thermal insulation material with a thermal conductivity less than that of the material of the first and/or second wall, wherein the thermal shield is positioned between the layer of thermal insulation material and the space.

* * * * *